United States Patent
Lin et al.

(10) Patent No.: US 9,466,488 B2
(45) Date of Patent: Oct. 11, 2016

(54) METAL-SEMICONDUCTOR CONTACT STRUCTURE WITH DOPED INTERLAYER

(71) Applicant: Taiwan Semiconductor Manufacturing Company, Ltd., Hsin-Chu (TW)

(72) Inventors: Yu-Hung Lin, Taichung (TW); Sheng-Hsuan Lin, Zhubei (TW); Chih-Wei Chang, Hsin-Chu (TW); You-Hua Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 73 days.

(21) Appl. No.: 14/273,794

(22) Filed: May 9, 2014

(65) Prior Publication Data

US 2015/0325484 A1    Nov. 12, 2015

(51) Int. Cl.
*H01L 21/8234*    (2006.01)
*H01L 21/265*    (2006.01)
(Continued)

(52) U.S. Cl.
CPC ............. *H01L 21/265* (2013.01); *H01L 21/28* (2013.01); *H01L 21/28568* (2013.01); *H01L 21/31105* (2013.01); *H01L 21/4763* (2013.01); *H01L 21/76802* (2013.01); *H01L 21/76877* (2013.01); *H01L 21/823418* (2013.01); *H01L 21/823475* (2013.01); *H01L 23/485* (2013.01); *H01L 23/528* (2013.01); *H01L 23/53209* (2013.01); *H01L 23/53266* (2013.01);
(Continued)

(58) Field of Classification Search
CPC .................... H01L 21/823475; H01L 21/265
USPC ........................................................ 438/238
See application file for complete search history.

(56) References Cited

U.S. PATENT DOCUMENTS 6,713,373 B1 * 3/2004 Omstead .......... H01L 21/76843
257/E21.17
2002/0102838 A1    8/2002 Paranjpe et al.
(Continued)

FOREIGN PATENT DOCUMENTS

| JP | H05291185 A | 11/1993 |
| KR | 20100072321 | 6/2010 |
| KR | 20140041970 | 4/2014 |
| WO | 2012083220 A2 | 6/2012 |

OTHER PUBLICATIONS

Janotti, Anderson et al. "Fundamentals of zinc oxide as a semiconductor," Reports on Progress in Physics, Oct. 22, 2009, vol. 72, Issue 12, IOP Publishing Ltd., 29 pages.
(Continued)

*Primary Examiner* — Ajay K Arora
(74) *Attorney, Agent, or Firm* — Slater Matsil, LLP

(57) ABSTRACT

Disclosed herein is a method of forming a metal-to-semiconductor contact with a doped metal oxide interlayer. An insulating layer is formed on a top surface of a semiconductor substrate with target region at the top surface of the semiconductor substrate. An opening is etched through the insulating layer with the opening exposing a top surface of a portion of the target region. A doped metal oxide interlayer is formed in the opening and contacts the top surface of the target region. The remainder of the opening is filled with a metal plug, the doped metal oxide interlayer disposed between the metal plug and the substrate. The doped metal oxide interlayer is formed from one of tin oxide, titanium oxide or zinc oxide and is doped with fluorine.

20 Claims, 7 Drawing Sheets

(51) Int. Cl.

| | |
|---|---|
| H01L 21/311 | (2006.01) |
| H01L 29/45 | (2006.01) |
| H01L 23/528 | (2006.01) |
| H01L 23/532 | (2006.01) |
| H01L 21/768 | (2006.01) |
| H01L 21/285 | (2006.01) |
| H01L 23/00 | (2006.01) |
| H01L 29/66 | (2006.01) |
| H01L 21/28 | (2006.01) |
| H01L 23/485 | (2006.01) |
| H01L 21/4763 | (2006.01) |

(52) U.S. Cl.
CPC .............. *H01L 24/02* (2013.01); *H01L 29/45* (2013.01); *H01L 29/66568* (2013.01); *H01L 23/53238* (2013.01); *H01L 23/53252* (2013.01); *H01L 2224/0231* (2013.01); *H01L 2224/02372* (2013.01); *H01L 2224/11* (2013.01); *H01L 2924/0103* (2013.01); *H01L 2924/0105* (2013.01); *H01L 2924/01074* (2013.01); *H01L 2924/0542* (2013.01); *H01L 2924/0544* (2013.01); *H01L 2924/05341* (2013.01); *H01L 2924/1304* (2013.01)

(56) References Cited

U.S. PATENT DOCUMENTS

| | | |
|---|---|---|
| 2002/0127849 A1 | 9/2002 | Lin et al. |
| 2004/0147104 A1 | 7/2004 | Lin et al. |
| 2008/0188076 A1 | 8/2008 | Morinaga et al. |
| 2009/0085145 A1 | 4/2009 | Feustel et al. |
| 2010/0203735 A1* | 8/2010 | Nakamura ............ C11D 7/3281 438/707 |
| 2010/0224916 A1 | 9/2010 | Shimizu et al. |
| 2011/0198589 A1 | 8/2011 | Lin et al. |
| 2014/0084375 A1 | 3/2014 | Lee et al. |

OTHER PUBLICATIONS

Lin, J. et al., "Increase in Current Density for Metal Contacts to N—Germanium by Inserting TiO2 Interfacial Layer to Reduce Schottky Barrier Height," Applied Physics Letters, 98, 2011, 4 pages.

Lin, Y.H. et al., "The Preparation and High Photon-Sensing Properties of Fluorinated Tin Dioxide Nanowires," Journal of the Electrochemical Society, 156 (11), 2009, 4 pages.

Mohri, S. et al., "Transparent Conductivity of Fluorine-Doped Anatase TiO2 Expitaxial Thin Films," Journal of Applied Physics, 111, 2012, 6 pages.

\* cited by examiner

METAL-SEMICONDUCTOR CONTACT STRUCTURE WITH DOPED INTERLAYER

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. In order to increase the density of active devices, the active devices are formed on a semiconductor substrate and connected to each other, other devices in a die, or to external devices through in redistribution layers (RDLs) with conductive lines in insulating layers. Interconnects in the RDLs are connected to individual elements in each active device with conductive plugs or contacts formed in an interlayer dielectric (ILD) between the semiconductor surface and the RDL. Passivation layers and post-passivation interconnects provide connection between the RDLs and a connector such as a solder ball, stud, bump or the like. The RDLs and passivation layers are frequently formed using back-end-of-line (BEOL) processes after the production of active semiconductor devices, but prior to singulating dies from a wafer.

BRIEF DESCRIPTION OF THE DRAWINGS

Aspects of the present disclosure are best understood from the following detailed description when read with the accompanying figures. Corresponding numerals and symbols in the different figures generally refer to corresponding parts unless otherwise indicated. The figures are drawn to illustrate the relevant aspects of the embodiments and it should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
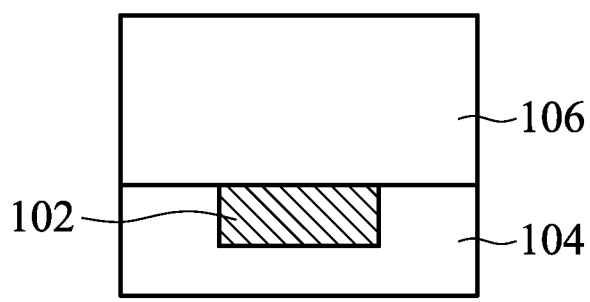
FIGS. 1-8 are cross-sectional views illustrating intermediate steps in a process for forming metal-semiconductor contacts with a doped interlayer according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Active devices formed on a semiconductor substrate are sometimes provided with electrical connectivity by metal plugs or contacts disposed in a dielectric or semiconductor layer such as an interlayer dielectric (ILD) or the like. Depending on the metal and the semiconductor material, where the metal contact contacts the semiconductor layer, a Schottky junction or barrier is formed. The Schottky barrier creates a rectifying contact due to Fermi-level pinning caused by the termination of the semiconductor crystal structure against a metal surface.

Disclosed herein is a method for forming a metal-semiconductor contact with a doped interlayer. It has been discovered that a contact with an outer interlayer of a metal oxide doped with fluorine reduces the Fermi-level pinning and also reduces the resistance to tunneling across the interlayer-semiconductor barrier. The reduced Fermi-level pinning and tunneling resistance permits a contact interface with less current resistance and degradation. It has also been discovered that, in some embodiments, the doping of the metal oxide interlayer is accomplished using the byproducts of etching the ILD layer or with plasma doping, resulting in less required annealing and dopant migration into the ILD and semiconductor layer. Additionally, using the byproduct of the etching process reduces the need to clean the ILD and semiconductor surface after etching, increasing throughput of active devices in the fabrication process.

FIG. 1 is a cross-sectional view illustrating a substrate 104 with an insulating layer 106 according to some embodiments. The substrate 104 is a semiconductor material such as silicon, gallium arsenide, silicon germanium, silicon carbide, silicon phosphide, or another semiconductor material. For example, in some embodiments, the substrate 104 is a wafer, active device, semiconductor-on-insulator layer, strained layer, epitaxial layer, or the like. The substrate has a target region 102 disposed therein. The target region 102 a portion of the substrate 104 where a subsequently formed metal-semiconductor contact will contact the substrate 104 and provide electrical connectivity. Depending on the structure formed on the substrate 104, the use, material and structure of the target region 102 will vary. For example, in an embodiment where a lateral transistor is formed on the substrate 104, the target structure is a source or drain, or a portion of the substrate bulk where, for example, the contact provides a substrate ground. In other embodiments, a FinFET is formed on the substrate 104, and the target region 102 is a source or drain in a raised fin, or a bipolar junction transistor is formed in the substrate, and the target region 102 is the emitter, collector or base. Similarly, where a diode is formed in the substrate 104, the target region 102 is an anode or cathode of the diode. It should be understood that the embodiments disclosed herein are not limited to a particular structure, and can be applied to any metal-to-semiconductor interface. Additionally, in some embodiments, the substrate 104 is a chip, die wafer or other semiconductor structure.

An insulating layer 106 is formed over the substrate 104 and covers the target region 102. In some embodiments, the insulating layer 106 is an oxide, nitride, oxynitride, carbide, or other insulating material. Depending on the insulating layer material, the insulating layer 106 is formed through a process such as chemical vapor deposition (CVD), plasma enhanced CVD (PECVD) low pressure CVD (LPCVD), atomic layer deposition (ALD), a spin-on glass process, thermal oxidation, or another deposition or formation process. In some embodiments, the insulating layer 106 is an ILD layer formed with a thickness to extend over and cover the structures disposed on the substrate 104. For example, where one or more planar transistors are formed on the substrate, the insulating layer 106 of the ILD extends over and covers the gate structure of the transistors, providing a substantially planar surface of subsequent layers.

Figure 2:
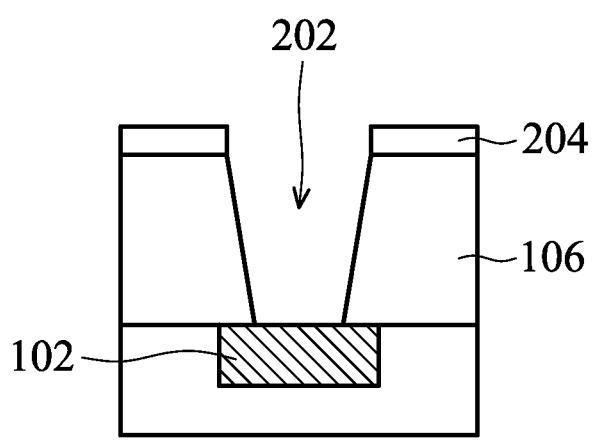

FIG. 2 is a cross-sectional view illustrating etching a contact opening 202 in the insulating layer 106 according to some embodiments. A mask 204 is formed over the insulating layer 106 and patterned to expose portions of the insulating layer 106 surface. In an embodiment, the mask 204 is a hard mask, such as a nitride or the like, that is deposited and etched to form the etching pattern. In another embodiment, the mask 204 is a resist such as a photoresist that is patterned, exposed and developed to form the pattern.

The insulating layer 106 is etched through the insulating layer 106 to create the opening 202, with the opening 202 extending through the insulating layer 106 to expose at least a portion of the target region 102. The insulating layer 106 is etched using, for example, a wet or dry etch, a wet or dry plasma etch process, a reactive ion etch, or another etching process. The reactants used to etch the insulating layer depend on the composition of the insulating layer 106. In some embodiments, a silicon dioxide ($SiO_2$) insulating layer 106 is etched with a fluorine based etchant such as hydrofluoric acid (HF), or a silicon nitride ($Si_3N_4$) layer is etched with a fluorine or phosphorus based etchant, such as phosphoric acid ($H_3PO_4$).

In some embodiments where the insulating layer is, for example, silicon dioxide, an oxide etching process is employed, which is highly selective for etching silicon dioxide compared to silicon. In such a process, nitrogen trifluoride ($NF_3$) and ammonia ($NH_3$) precursors are used to remotely generate ammonium fluoride ($NH_4F$) and ammonium bifluoride ($NH_4F \cdot HF$) etchants using a plasma or RF source. See, Eqn. 1.

$$NF_3 + NH_3 \rightarrow NH_4F + NH_4F \cdot HF \quad 1)$$

The etchants are then used to etch the silicon dioxide insulating layer 106. See, Eqns. 2-3.

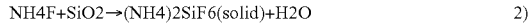

$$NH4F + SiO2 \rightarrow (NH4)2SiF6(solid) + H2O \quad 2)$$

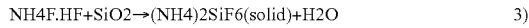

$$NH4F \cdot HF + SiO2 \rightarrow (NH4)2SiF6(solid) + H2O \quad 3)$$

The oxide etching process permits low temperature etching, for example, between about 20° C. and about 50° C. The remote plasma generation of the etchants provides active etchants without plasma damage to the substrate 104.

Figure 3:
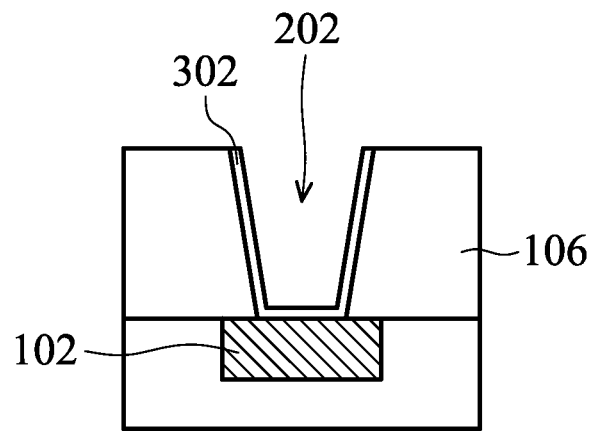

FIG. 3 is a cross-sectional view illustrating the substrate 104 after etching the opening 202 according to some embodiments. The mask 204 (See FIG. 2) is removed from the insulating layer 106. In some embodiments, the etching process leaves a residue or byproduct 302. For example, as shown above in Eqns. 2 and 3, the oxide etching process results in ammonium hexafluorosilicate (($NH_4$)$_2SiF_6$) byproduct. The etching byproduct 302 is, in some embodiments, removed through an anneal, or cleaned with a wash, rinse, etch or another cleaning process.

It has been discovered that leaving an etching byproduct in the bottom and on the sidewalls of the opening 202 permits the use of the byproduct in later processing steps. For example, in some embodiments, the etching byproduct 302 is used to at least partially dope a subsequently deposited layer. Thus, an etchant may be selected to leave an etching byproduct 302 with a desired dopant for subsequent doping into a deposited layer. This permits the avoidance of a cleaning or annealing step to remove the etching byproduct 302, increasing processing speed and throughput.

Figure 4:
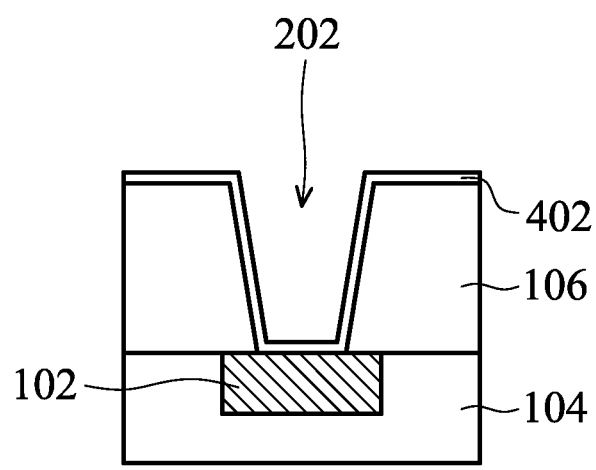

FIG. 4 is a cross-sectional view illustrating formation of an interlayer 402 according to some embodiments. A metal oxide interlayer 402 is formed over the insulating layer 106 and in the opening 202. The interlayer 402 is disposed in at least the bottom of the opening 202, and contacts the target region 102. In some embodiments, the interlayer 402 contacts the surface of the substrate 104 directly in the target region 102. In other embodiments, incidental layers such as a native oxide, etch stop layer, barrier layer, or the like are disposed between the substrate and the interlayer 402. In some embodiments, a cleaning process is performed to remove, for example, a native oxide, or the native oxide can be avoided by maintaining the exposed substrate 104 surface in a vacuum or in an oxygen or oxidizer free environment.

In some embodiments, the interlayer 402 is formed from a metal oxide such as $TiO_2$, $SnO_2$, ZnO, or another oxide using a deposition technique such as atomic layer deposition (ALD), physical vapor deposition (PVD), chemical vapor deposition (CVD) or the like. It has been discovered that $TiO_2$, $SnO_2$, ZnO can be doped with fluorine (F) and provide the unexpected results, when doped, of reducing the Fermi-level pinning of the bandgap of the substrate semiconductor material and of lowering the tunneling resistance across the interlayer-substrate interface. The reduced Fermi-level pinning provides greater conductivity across the interlayer-substrate interface by reducing the Schottky barrier height. Additionally, a lowered tunneling resistance provided by the doped interlayer 402 permits greater conductivity across the interlayer-substrate interface by allowing increased numbers of electrons to transit the interface by tunneling instead of overcoming the Schottky barrier.

In an embodiment, the interlayer 402 is formed using an ALD process to create a bottom portion of the interlayer 402 contacting the target region 102 with a thickness between about 5 angstroms and about 150 angstroms. The thickness of the interlayer 402 on the sidewalls of the opening 202 is generally the less than the thickness as the bottom portion. Such a thickness for the interlayer bottom portion has been determined to result in a doping concentration that provides a donor electron density that reduces the Fermi-level pinning and tunneling resistance. Thus, a substantially ohmic contact is created between the interlayer 402 and the substrate 104 without requiring a silicide or other modification to the substrate 104, resulting in a substantially silicide free target region 102. The ALD process deposits a metal layer, which is then oxidized. For example, in some embodiments, the ALD process uses tetrakis-dimethyl-amino-titanium (TD- MAT or $C_8H_{24}N_4Ti$), titanium tetrachloride (TiCl4), titanium methoxide (Ti(OMe)$_4$ where Me is a methyl group) or the like as a precursor for titanium deposition in a temperature range between about 100° C. and about 500° C., diethyl zinc (DEZ or $Zn(C_2H_5)_2$) or the like as a precursor for zinc deposition in a temperature range between about 100° C. and about 500° C., or dibutyl tin diacetate (DBTDA or $(C_4H_9)_2Sn(OOCCH_3)_2$), tin(IV) chloride (SnCl$_4$), tin (II) chloride (SnCl$_2$) or the like as a precursor for tin deposition in a temperature range between about 50° C. and about 500° C. After ALD deposition of a metal layer, the metal layer is oxidized with, for example, oxygen (O$_2$), ozone (O$_3$), water (H$_2$O) or another oxidizer. In some embodiments, ALD process may be repeated to build up the interlayer 402 to the desired thickness.

In other embodiments, the interlayer is formed using a PVD or CVD process such as plasma enhanced CVD (PECVD), low pressure CVD (LPCVD), sputtering, evaporative vapor deposition, or the like. In such embodiments, a metal oxide interlayer 402 is formed by depositing a metal and subsequently oxidizing the metal, or by depositing a metal oxide.

In some embodiments where the etching byproduct 302 (See FIG. 3) is not removed by annealing or cleaning, the interlayer 402 is deposited over the etching byproduct 302. The byproduct 302 is incorporated into the interlayer 402. For example, where the oxide etch is used to etch the opening 202 in the insulating layer 106, an ammonium hexafluorosilicate byproduct 302 is left on the opening 202 surfaces. When a metal layer is formed over the ammonium hexafluorosilicate byproduct 302, the ammonium hexafluorosilicate byproduct 302 breaks down and is incorporated into the metal layer. The fluorine in the ammonium hexafluorosilicate byproduct 302 acts as a dopant for the metal layer, remaining in the metal layer during oxidation and subsequent ALD metal layer depositions steps, forming a doped metal oxide interlayer 402. In some embodiments, the interlayer 402 is annealed at a relatively low temperature or for a brief period to drive the dopant from the etching byproduct 302 into the interlayer 402 without providing significant doping to the insulating layer 106 and substrate 104. It has been discovered that the low temperature or short duration anneal and drive in prevents migration of the dopant into the insulating layer 106 and substrate 104.

Figure 5:
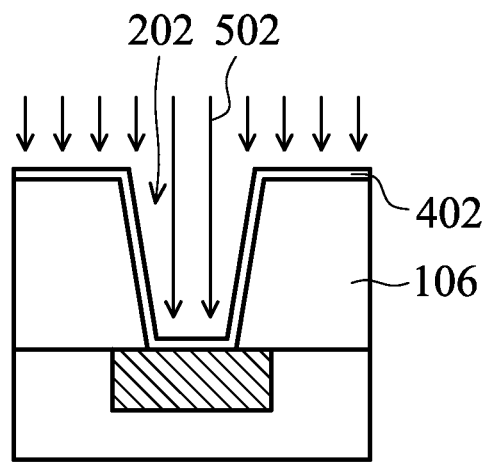

FIG. 5 is a cross-sectional view illustrating implant doping of the interlayer 402 according to some embodiments. The interlayer 402 is doped with a donor-type dopant 502. In some embodiment, the interlayer 402 is doped with an RF plasma treatment or PECVD deposition of, for example, fluorine or the like. In an example where a plasma treatment is used, the duration of the plasma treatment is between about 5 seconds and about 500 seconds at a power between about 50 W and about 2000 W. A gas flow between about 5 sccm and about 500 sccm using a precursor such as carbon tetrafluoride (CF$_4$) or hexafluoroethane (C$_2$F$_6$) is used to dope the interlayer 402 with a fluorine concentration between about 0.1% and about 15% in the metal-to-semiconductor contact region at the bottom of the opening 202. It has been found that the aforementioned parameters result in doping that reduces the Fermi-level pinning of the bandgap of the substrate semiconductor material and lowers the tunneling resistance across the interlayer-substrate interface. Additionally, doping the interlayer 402 with a plasma doping process ensures that the doping is substantially consistent through the interlayer 402. It should be noted that doping of the interlayer 402 in the sidewall regions has little effect on the characteristics of the contact between the interlayer 402 and the target region 102. In some embodiments, the dopant used to dope the interlayer 402 is different from the dopant used to dope target regions 102 or other doped regions of the substrate 104. It should be further noted that, while the embodiments are described as having an interlayer doped with fluorine, other embodiments may comprise one or more other dopants that reduce the Fermi-level pinning and tunneling resistance, and that the parameters for doping may be modified according to the dopants.

Figure 6:
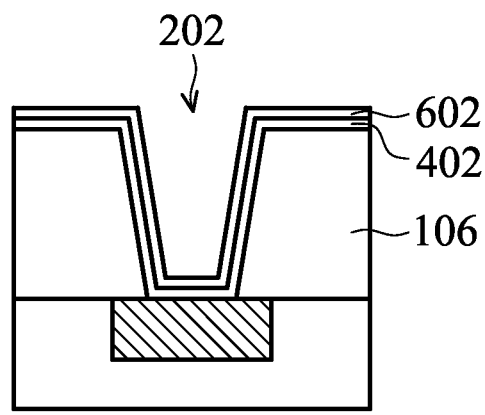

FIG. 6 is a cross-sectional view illustrating formation of a glue layer or adhesion layer 602 according to some embodiments. The adhesion layer 602 is deposited via ALD, CVD, epitaxy or another deposition process. In some embodiments, the adhesion layer 602 is formed from titanium nitride (TiN) or another material to a thickness between about 10 angstroms and about 40 angstroms.

Figure 7:
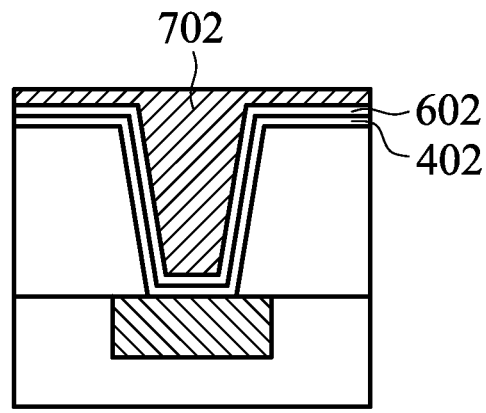

FIG. 7 is a cross-sectional view illustrating formation of the plug 702 with a fill layer according to some embodiments. The fill layer is deposited in, and extends over, the opening 202 (See FIGS. 2-6) so that the opening 202 is filled with a conductive material that may be a metal such as tungsten (W), copper (Cu), gold (Au) or the like, or an alloy, a polysilicon, or another conductive material. The plug 702 is formed, in some embodiments, by depositing the conductive material with CVD, PVD, sputtering, or another deposition process. In some embodiments, a seed layer is formed over the adhesion layer 602, and the fill layer is formed by electroplating, electroless plating, or another plating process. In such embodiments, the seed layer is formed using ALD, CVD or the like, and the seed layer is integrated into the fill layer during the deposition of the fill layer.

Figure 8:
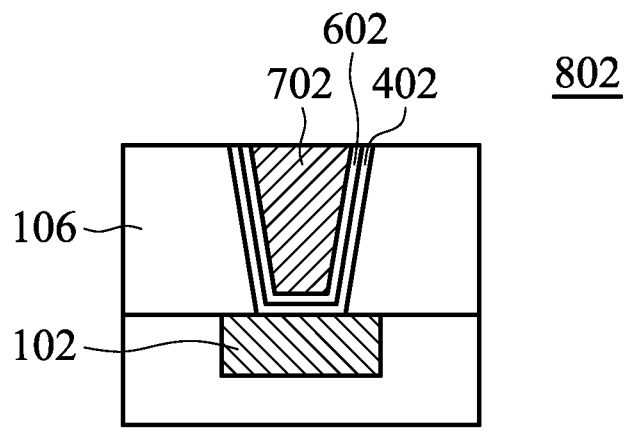

FIG. 8 is a cross-sectional view illustrating planarization of a contact 802 according to an embodiment. In such an embodiment, portions of the interlayer 402, adhesion layer 602 and plug 702 are planarized, for example, with a chemical mechanical polish (CMP) process, with an etch, a mechanical polish or grinding process, or another planarizing process. In some embodiments, the insulating layer 106 is also planarized to achieve a desired thickness. The resulting contact 802 has an interlayer 402, adhesion layer 602 and plug 702 with top surface substantially planar or level with each other and with the top surface of the insulating layer 106. The target region 102 is substantially silicide free. Additionally, the target region 102 is substantially free of the dopant used to dope the interlayer 402.

Figure 9:
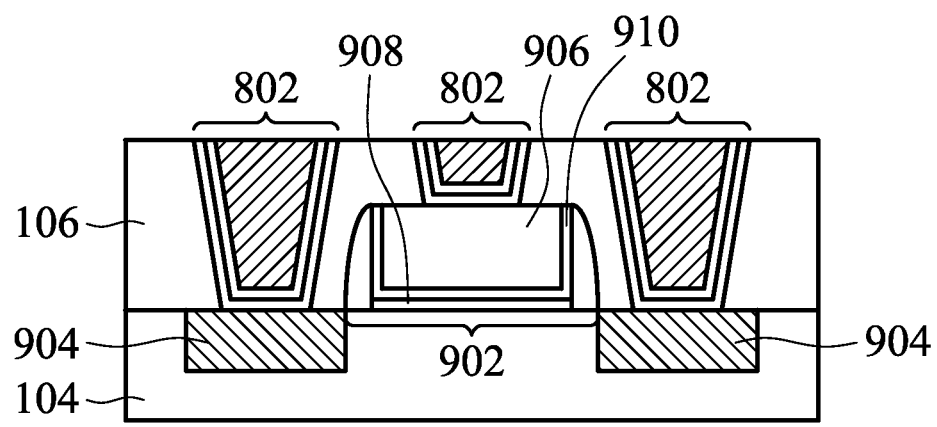
FIGS. 9-11B are cross-sectional views illustrating metal-semiconductor contacts with a doped interlayer in different contexts according to some embodiments.

FIG. 9 is a cross-sectional view illustrating a planar transistor active device with contacts 802 according to some embodiments. In such an embodiment, the insulating layer 106 is an ILD, with contacts 802 extending through the insulating layer 106 and contacting the source/drain regions 904 disposed in the substrate 104. The transistor also has a gate structure 902, with, for example, an interfacial layer 908, a gate dielectric 910 and a gate contact 906. In some embodiments, a contact 802 with a doped interlayer is formed over, and contacts, the gate contact 906. However, in some embodiments, the gate contact 906 is formed from a metal alloy or other material where a Schottky junction interface would not be formed. In some embodiments, the contact 802 for the gate structure 902 is a contact without a doped interlayer. Where a structure, circuit or device has multiple semiconductor target regions, such as sources and drains 904, multiple contacts 802 may be formed in a single process. In such embodiments, the interlayer 402, adhesion layer 602 and plug 702 in each contact 802 are each formed from single layers spanning multiple openings in the insulating layer 106, and are subsequently separated when the contact is planarized by a CMP or the like. (See, e.g., FIG. 8.)

Figure 10:
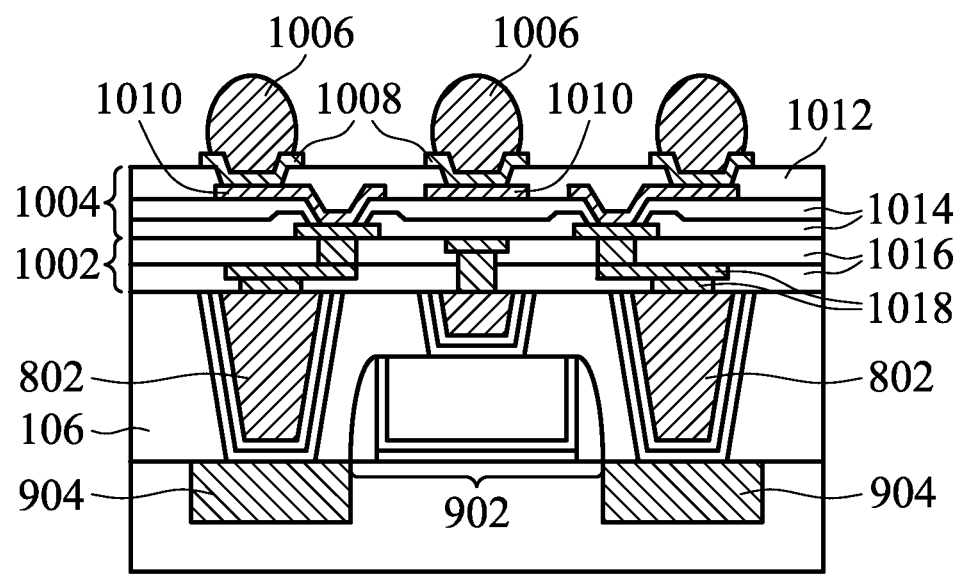

FIG. 10 is a cross-sectional view illustrating a package having planar transistor with contacts 802 according to some embodiments. An RDL 1002 and one or more finishing layers 1004 are formed over the ILD insulating layer 106. The RDL 1002 has one or more metal features 1018 disposed in dielectric layers 1016 in contact with the contact 802 and that provide electrical connectivity between the contacts 802 and external devices. In some embodiments, the finishing layers 1004 comprise one or more passivation layers 1014 with post-passivation interconnects (PPIs) 1010 disposed over, and extending through openings in the passivation layers 1014. One or more protective layers 1012 are disposed over the passivation layers 1014 and the PPIs 1010 and underbump metallization structures 1008 and connectors 1006 are formed over the protective layers 1012 and provide mounting of the package to, and electrical communication with, an external device such as a die, package, interposer, PCB or the like. Thus, the contacts 802 are in electrical contact with the RDL 1002 and the RDL is in electrical contact with the connectors 1006.

Figure 11A:
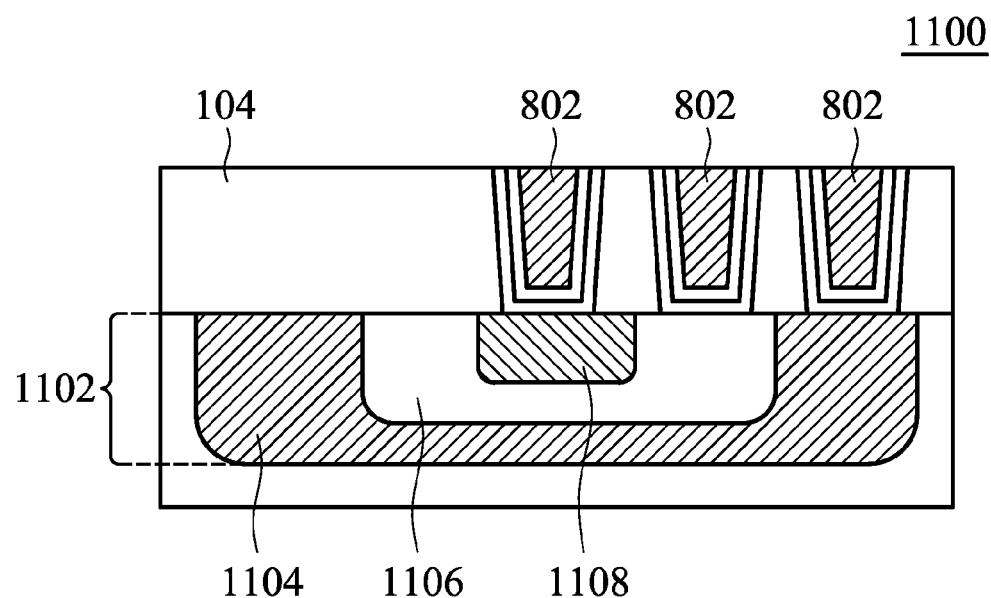

FIG. 11A is a cross-sectional view illustrating a bipolar junction transistor (BJT) device 1100 with contacts 802 according to some embodiments. The BJT device has wells 1102 formed in a substrate. The wells 1102 form the emitter 108, base 1106 and collector 1104. At least one contact 802 is formed to contact, and provide electrical connectivity with, each one of the wells 1102.

Figure 11B:
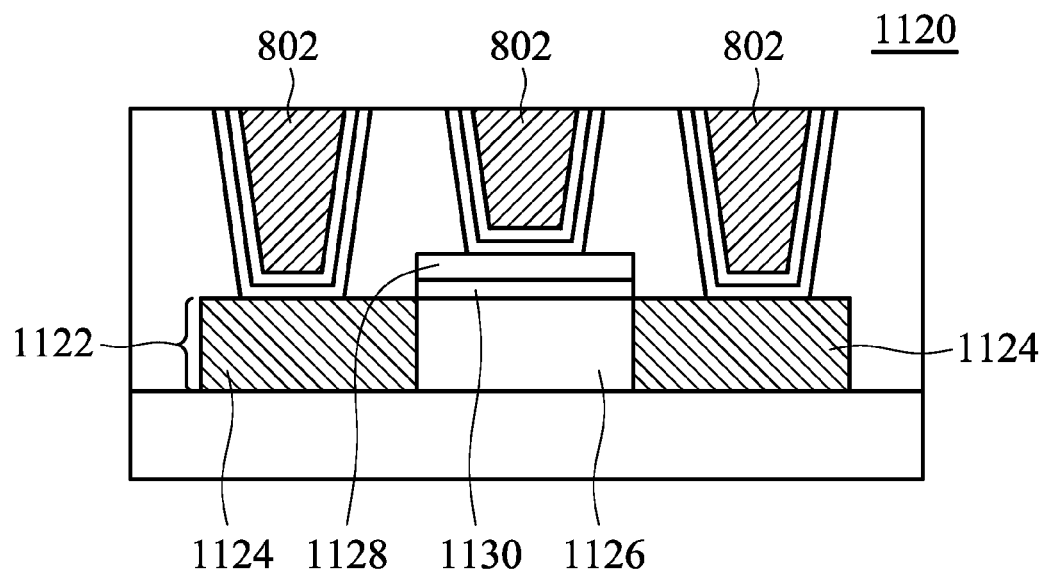

FIG. 11B is a cross-sectional view illustrating a FinFET structure 1120 with contacts 802 according to some embodiments. The FinFET has a fin 1122 with source/drain regions 1124 and a channel region 1126. A gate dielectric 1130 and gate contact 1128 are disposed on the top and sidewall surfaces of the fin 1122 and wrap around the channel region. Contacts 802 provide electrical connectivity to the source/drain regions 1124. In some embodiments, a contact 802 with a doped interlayer according to the embodiments is used as a contact for the gate.

Figure 12:
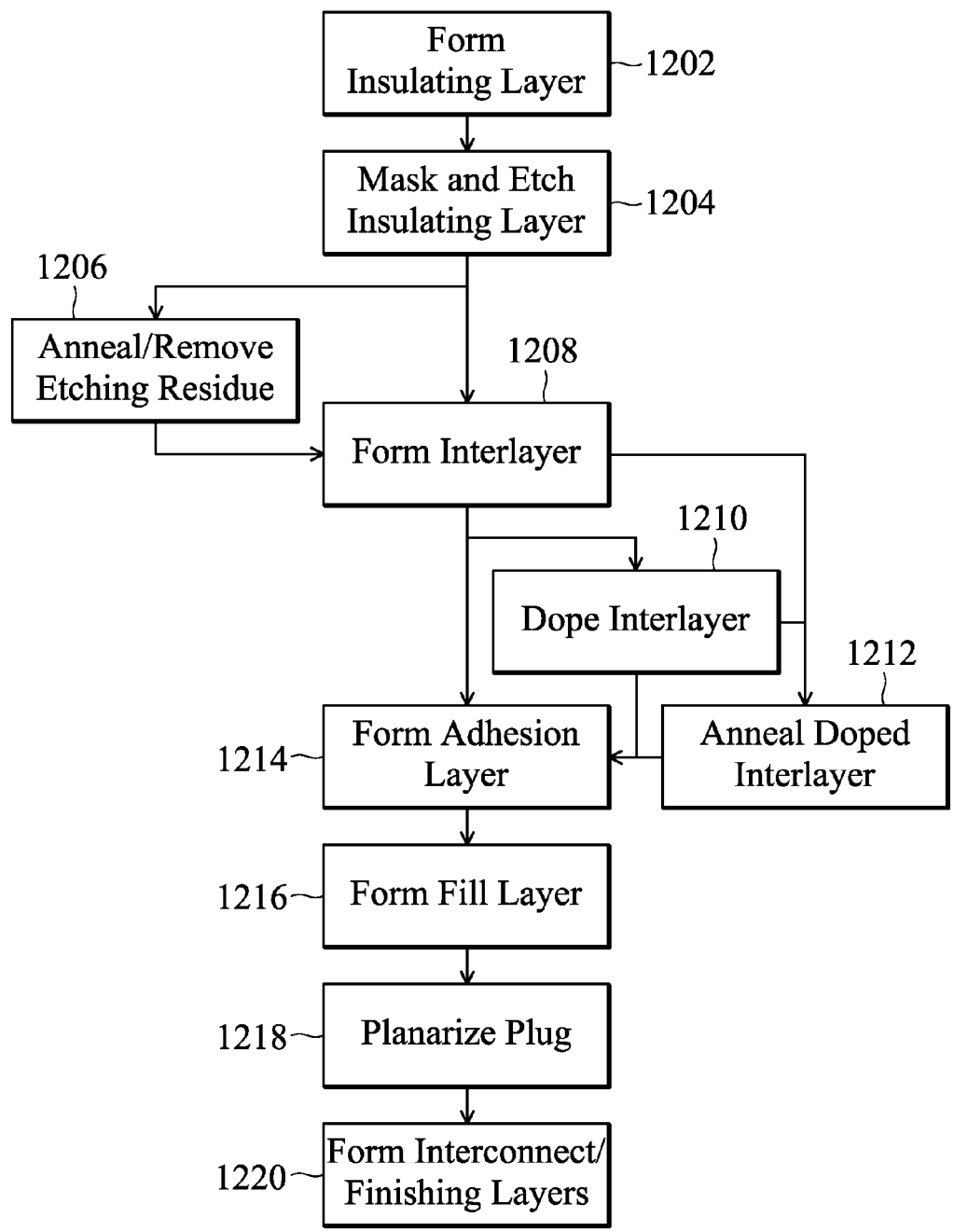
FIG. 12 is a flow diagram illustrating a method of forming metal-semiconductor contacts with a doped interlayer according to some embodiments.

FIG. 12 is a flow diagram illustrating a method 1200 for forming a structure with contact having a doped interlayer according to some embodiments. An insulating layer is formed in block 1202, with the insulating layer disposed over a substrate having one or more target regions. The insulating layer is masked and etched in block 1204, and an opening exposing a target region on the substrate is formed by the etching. In some embodiments, any etching residue or byproduct is removed in block 1206 through cleaning or annealing. The interlayer is formed, in block 1208, in the opening in the insulating layer. In some embodiments, the interlayer is doped in block 1210 and the doped interlayer is annealed in block 1212. In some embodiments, the interlayer is doped with, for example, fluorine or the like by a plasma implant, by using the etching residue or byproduct, by a combination of implant and residue re-use or another technique. An adhesion layer is formed over the interlayer in block 1214, with the adhesion layer extending into the opening in the insulating layer and contacting the target region. A fill layer is formed in block 1216, with the fill layer forming a plug that fills the remainder of the opening in the insulating layer. The plug, adhesion layer and interlayer are planarized in block 1218 and subsequent interconnect and finishing layers such as RDL layers and passivation layers and associated interconnects are formed in block 1220. In some embodiments, one or more connectors are formed, in block 1220 over the finishing layers, permitting the substrate to be bonded to a package, carrier, PCB, die or the like, as in, for example, a 3D IC, vertically stacked package, flip-chip arrangement, or the like. Additionally, the substrate is, in some embodiments, singulated, tested and packaged after formation of the finishing layers.

Thus, a method of forming a device according to an embodiment comprises forming an insulating layer on a top surface of a semiconductor substrate. A target region disposed at the top surface of the semiconductor substrate. An opening is etched through the insulating layer with the opening exposing a top surface of a portion of the target region. A doped metal oxide interlayer is formed in the opening and contacting the top surface of the target region and the remainder of the opening is filled with a metal plug, the doped metal oxide interlayer disposed between the metal plug and the substrate. In some embodiments, etching the opening comprises generating an etching byproduct disposed on surfaces of the opening and comprising a first dopant. Forming the doped metal oxide interlayer comprises forming a metal oxide interlayer over the etching byproduct, and the first dopant from the etching byproduct at least partially dopes the metal oxide interlayer. In another embodiment, forming the doped metal oxide interlayer comprises implanting a first dopant into a metal oxide interlayer. The metal oxide interlayer is formed from one of tin oxide, titanium oxide or zinc oxide. A transistor is formed on the substrate before the forming the insulating layer, with the target region being a source or a drain of the transistor. In some embodiments, the metal oxide interlayer is doped with fluorine.

A method of forming a device according to an embodiment comprises forming an insulating layer on a top surface of a semiconductor substrate having at least one active device formed therein with a target region of the at least one active device disposed at the top surface of the substrate. An opening is etched through the insulating layer such that the opening exposes the target region. A metal oxide interlayer is formed in the opening and contacting the target region and metal oxide interlayer is doped with a first dopant. An adhesion layer is formed in the opening and disposed over the doped metal oxide interlayer. A metal plug is formed in the opening and over the adhesion layer, with the doped metal oxide interlayer disposed between the metal plug and the substrate. A redistribution layer (RDL) is formed over the top surface of the insulating layer, a metal feature of the RDL in electrical contact with the metal plug. Forming the metal oxide interlayer comprises forming the metal oxide interlayer from one of tin oxide, titanium oxide or zinc oxide. Forming the doping metal oxide interlayer comprises implanting a first dopant into the metal oxide interlayer. Implanting the first dopant comprises implanting fluorine in the metal oxide interlayer. In some embodiments, a transistor is formed on the substrate before forming the insulating layer, and the target region is a source or a drain of the transistor. The target region is doped with a second dopant different from the first dopant and the target region is substantially free of silicide.

A structure according to an embodiment comprises an insulating layer disposed over a semiconductor substrate and having an opening extending there through, with a first surface of the substrate disposed at a bottom of the opening. An interlayer of a contact is disposed in the opening and has a first portion contacting the first surface of the substrate. A metal plug of the contact is disposed in the opening, the interlayer separating the metal plug from the first surface of the substrate. The wherein the interlayer comprises a doped oxide. In an embodiment, the interlayer comprises a doped metal oxide. The metal oxide of the doped metal oxide is one of tin oxide, titanium oxide or zinc oxide and the doped metal oxide is doped with fluorine doped to a concentration between about 0.1% and about 15%. The structure further comprises an adhesion layer disposed between the interlayer and the metal plug, the adhesion layer comprising titanium nitride and the metal plug comprising tungsten. A topmost surface of the metal plug is substantially level with a topmost surface of the interlayer, a topmost surface of the adhesion layer and a topmost surface of the insulating layer. In some embodiments, a redistribution layer (RDL) having at least one metal feature electrically is connected to the metal plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device, comprising:
   forming an insulating layer on a top surface of a semiconductor substrate, a target region disposed at the top surface of the semiconductor substrate;
   etching an opening through the insulating layer, the opening exposing a top surface of a portion of the target region, the etching comprising generating an etching byproduct disposed on surfaces of the opening;
   without removing the etching byproduct, forming a doped metal oxide interlayer in the opening and contacting the top surface of the target region; and
   filling a remainder of the opening with a metal plug, the doped metal oxide interlayer disposed between the metal plug and the substrate.

2. The method of claim 1, wherein the etching the etching byproduct comprises a first dopant, and wherein the forming the doped metal oxide interlayer comprises forming a metal oxide interlayer over the etching byproduct, and wherein the first dopant from the etching byproduct at least partially dopes the metal oxide interlayer.

3. The method of claim 1, wherein the forming the doped metal oxide interlayer comprises implanting a first dopant into a metal oxide interlayer.

4. The method of claim 3, wherein the forming the doped metal oxide interlayer comprises forming the metal oxide interlayer from one of tin oxide, titanium oxide or zinc oxide.

5. The method of claim 1, further comprising forming a transistor on the substrate before the forming the insulating layer, wherein the target region is a source or a drain of the transistor.

6. The method of claim 1, wherein the forming the doped metal oxide interlayer comprises forming a metal oxide interlayer doped with fluorine.

7. A method of forming a device, comprising:
   forming an insulating layer on a top surface of a semiconductor substrate having at least one active device formed therein, a target region of the at least one active device disposed at the top surface of the substrate;
   etching an opening through the insulating layer, the opening exposing the target region;
   forming a metal oxide interlayer in the opening and contacting the target region, wherein the target region is substantially free of silicide;
   doping the metal oxide interlayer with a first dopant;
   forming an adhesion layer in the opening and disposed over the doped metal oxide interlayer;
   forming a metal plug in the opening and over the adhesion layer, the doped metal oxide interlayer disposed between the metal plug and the substrate; and
   forming a redistribution layer (RDL) over the top surface of the insulating layer, a metal feature of the RDL in electrical contact with the metal plug.

8. The method of claim 7, wherein the forming the metal oxide interlayer comprises forming the metal oxide interlayer from one of tin oxide, titanium oxide or zinc oxide.

9. The method of claim 8, wherein the forming the metal oxide interlayer comprises implanting the first dopant into the metal oxide interlayer.

10. The method of claim 9, wherein the implanting the first dopant comprises implanting fluorine in the metal oxide interlayer.

11. The method of claim 10, further comprising forming a transistor on the substrate before forming the insulating layer, wherein the target region is a source or a drain of the transistor; and
   wherein the target region is doped with a second dopant different from the first dopant.

12. The method of claim 1, wherein the doped metal oxide interlayer is doped to a concentration between about 0.1% and about 15%.

13. The method of claim 1, further comprising forming an adhesion layer on the doped metal oxide interlayer in the opening before filling the remainder of the opening with the metal plug.

14. The method of claim 13, further comprising planarizing a top surface of the insulating layer, a top surface of the doped metal oxide interlayer, a top surface of the adhesion layer, and a top surface of the metal plug.

15. A method of forming a device, comprising:
   forming an insulating layer over a top surface of a substrate;
   etching the insulating layer to form a contact opening, wherein after the etching an etching residue remains on a bottom and sidewalls of the contact opening;
   depositing an interlayer into the contact opening and over the insulating layer, wherein at least a portion of the etching residue is incorporated into the interlayer; and
   filling the contact opening with a conductive material.

16. The method of claim 15, wherein the etching residue comprises fluorine, the method further comprising annealing the interlayer to incorporate the etching residue into the interlayer.

17. The method of claim 16, further comprising doping the interlayer with fluorine before filling the contact opening.

18. The method of claim 15, further comprising doping the interlayer with fluorine before filling the contact opening.

19. The method of claim 15, further comprising depositing a glue layer on the interlayer before filling the contact opening.

20. The method of claim 15, wherein the depositing the interlayer further comprises: depositing a bottom portion of the interlayer and depositing sidewall portions of the interlayer, wherein a thickness of the bottom portion is thicker than a thickness of the sidewall portions.

\* \* \* \* \*

UNITED STATES PATENT AND TRADEMARK OFFICE
CERTIFICATE OF CORRECTION

PATENT NO. : 9,466,488 B2
APPLICATION NO. : 14/273794
DATED : October 11, 2016
INVENTOR(S) : Yu-Hung Lin Page 1 of 1

It is certified that error appears in the above-identified patent and that said Letters Patent is hereby corrected as shown below:

In the Claims

In Column 9, Line 43, Claim 2, delete "wherein the etching the etching" and insert --wherein the etching--.

Signed and Sealed this
Third Day of January, 2017

Michelle K. Lee
*Director of the United States Patent and Trademark Office*